(12) United States Patent
Teng et al.

(10) Patent No.: US 8,269,517 B2
(45) Date of Patent: Sep. 18, 2012

(54) HANDLER AND METHOD FOR TESTING THE SAME

(75) Inventors: Cheng-Yung Teng, Xindian (TW); Shao-Tien Kan, Taipei (TW); Yu-Sheng Chen, Xindian (TW)

(73) Assignee: Princeton Technology Corporation, Sindian, Taipei (TW)

( * ) Notice: Subject to any disclaimer, the term of this patent is extended or adjusted under 35 U.S.C. 154(b) by 505 days.

(21) Appl. No.: 12/643,428

(22) Filed: Dec. 21, 2009

(65) Prior Publication Data

US 2010/0154505 A1  Jun. 24, 2010

(30) Foreign Application Priority Data

Dec. 23, 2008 (TW) ............................... 97150244 A

(51) Int. Cl.
*G01R 31/20* (2006.01)
(52) U.S. Cl. ............... 324/757.01; 324/750.13; 209/573
(58) Field of Classification Search .............. 324/757.01
See application file for complete search history.

(56) References Cited

U.S. PATENT DOCUMENTS 6,184,675 B1 * 2/2001 Bannai .................... 324/750.03
6,198,274 B1 * 3/2001 Onishi .................... 324/750.18

* cited by examiner

*Primary Examiner* — Patrick Assouad
*Assistant Examiner* — Son Le
(74) *Attorney, Agent, or Firm* — Muncy, Geissler, Olds & Lowe, PLLC

(57) ABSTRACT

The invention provides a handler and a method for testing the same. The handler comprises a sorter and a testing module. The testing module further comprises a signal generator, a sensor, and a signal comparator. The signal generator generates and sends out a first handling signal. The sorter receives the first handling signal and correspondingly places a first electronic component on a first region according to the first handling signal. The sensor senses the first electronic component on the first region, and then correspondingly generates and sends out a second handling signal. The signal comparator is electrically connected to the sensor and the signal generator, and receives the first handling signal and the second handling signal. The signal comparator determines whether the first handling signal is equivalent to the second handling signal, and correspondingly sends out a comparing signal.

32 Claims, 5 Drawing Sheets

HANDLER AND METHOD FOR TESTING THE SAME

BACKGROUND OF THE INVENTION

1. Field of the Invention

The present invention relates to a handler and a method for testing the same, and more particularly, it relates to a handler capable of sorting integrated circuits (IC) and a method for self-testing the same.

2. Description of the Prior Art

IC test handler is major applied to back-end process (back-end of the line) of semiconductor fabrication and is a machine capable of sorting ICs. Please refer to FIG. 1. FIG. 1 illustrates a conventional IC test handler. The conventional IC test handler includes a sorter 10, a tester 12, and multiple cables 14. The sorter 10 is electrically connected with the tester 12 via the cables 14. The sorter 10 further includes a tray or a tube, and the un-sorted ICs are disposed on the tray or the tube of the sorter 10.

The tester 12 tests the IC disposed on the tray or the tube and then transmits a testing result to the sorter 10 for sorting. For example, the sorter 10 includes three regions (the first region, the second region, and the third region) respectively corresponding to three quality types (GOOD, PERMISSIBLE, and FAILURE). For example, when the tester 12 tests an IC and the testing result is of PERMISSIBLE quality, the sorter 10 disposes the IC on the second region according to the testing result.

Different ICs respectively have different electric functions, thus the tester 12 is connected with the sorter 10 for transmitting testing signals by using multiple cables 14.

From the above-mentioned description, the sorter 10 for sorting IC does not have the function of self-testing. The sorting capability of the sorter 10 needs the testing function provided by the tester 12, so the communication between the sorter 10 and the tester 12 have to be kept un-interrupted, for example, the cables for communication have to be non-defective. Besides, whether the sorting result of the sorter 10 is correct or not still depends on human determination.

In other words, before the conventional IC test handler sorts ICs, it is necessary to confirm that the tester and all cables are non-defective. After the IC test handler sorts ICs, whether the sorting result is correct or not still depends on human determination. The traditional testing and sorting method not only waste time but also cost a lot of manpower. Therefore, the invention provides a handler with the sorting and the self-testing capability to solve the aforementioned problems.

SUMMARY OF THE INVENTION

Accordingly, an aspect of the present invention is to provide a handler with the self-testing capability. The handler sorts electrical components (e.g. ICs) according to a first handling signal, and then generates a second handling signal by detecting the sorted electrical component. The handler compares the first handling signal and the second handling signal to achieve the goal of self-testing.

According to an embodiment of the invention, the handler of the invention includes a sorter and a testing module. The testing module which is detachably connected with the sorter includes a signal generator, a sensor, and a signal comparator. The signal generator generates and sends out a first handling signal. The sorter receives the first handling signal and correspondingly places a first electronic component on a first region according to the first handling signal. The sensor senses the first electronic component disposed on the first region for correspondingly generating and sending out a second handling signal. The signal comparator is electrically connected to the sensor and the signal generator, receives the first handling signal and the second handling signal, and determines whether the first handling signal is equivalent to the second signal or not and correspondingly sends out a comparing signal.

If the signal comparator determines that the first handling signal is equivalent to the second handling signal, the sent comparing signal is a positive signal. On the contrary, if the signal comparator determines that the first handling signal is different from the second handling signal, the sent comparing signal is a negative signal. After the signal generator receives the positive signal, the signal generator continues to send out a handling signal to the sorter to keep sorting. On the contrary, after the signal generator receives the negative signal, the signal generator stops sending out a handling signal or sends out a terminating signal to the sorter to stop sorting. By doing so, when the sorting result is incorrect (i.e. the first handling signal is different from the second handling signal), the handler of the invention can self-stop to achieve the goal of self-testing.

Another aspect of the invention is to provide a testing method for a handler. The handler sorts electrical components (e.g. ICs) according to a first handling signal, and then generates a second handling signal by detecting the sorted electrical component. The handler compares the first handling signal and the second handling signal to achieve the goal of self-testing.

According to one embodiment of the invention, the testing method of the invention includes the following steps of: first of all, generating and sending out a first handling signal; next, correspondingly placing a first electronic component on a first region according to the first handling signal; then sensing the first electronic component disposed on the first region to generate and send out a second handling signal; subsequently, receiving the first handling signal and the second handling signal; and determining whether the first handling signal is equivalent to the second handling signal and correspondingly sending out a comparing signal.

To sum up, the handler sorts electrical components (e.g. ICs) according to a first handling signal, and then generates a second handling signal by detecting the sorted electrical component. The handler compares the first handling signal and the second handling signal to generate the comparing signal. The handler keeps or stops sorting ICs according to the comparing signal, so that the handler of the invention can achieve the goal of self-testing. Compared with the prior art, the handler and the testing method for the same do not need a tester and the cables connecting the tester and the sorter. Thereby the invention not only reduces the equipment cost (e.g. the tester and the cables), but also reduces the human error.

The objective of the present invention will no doubt become obvious to those of ordinary skill in the art after reading the following detailed description of the preferred embodiment, which is illustrated in the various figures and drawings.

BRIEF DESCRIPTION OF THE APPENDED DRAWINGS

DETAILED DESCRIPTION OF THE INVENTION

Figure 1:
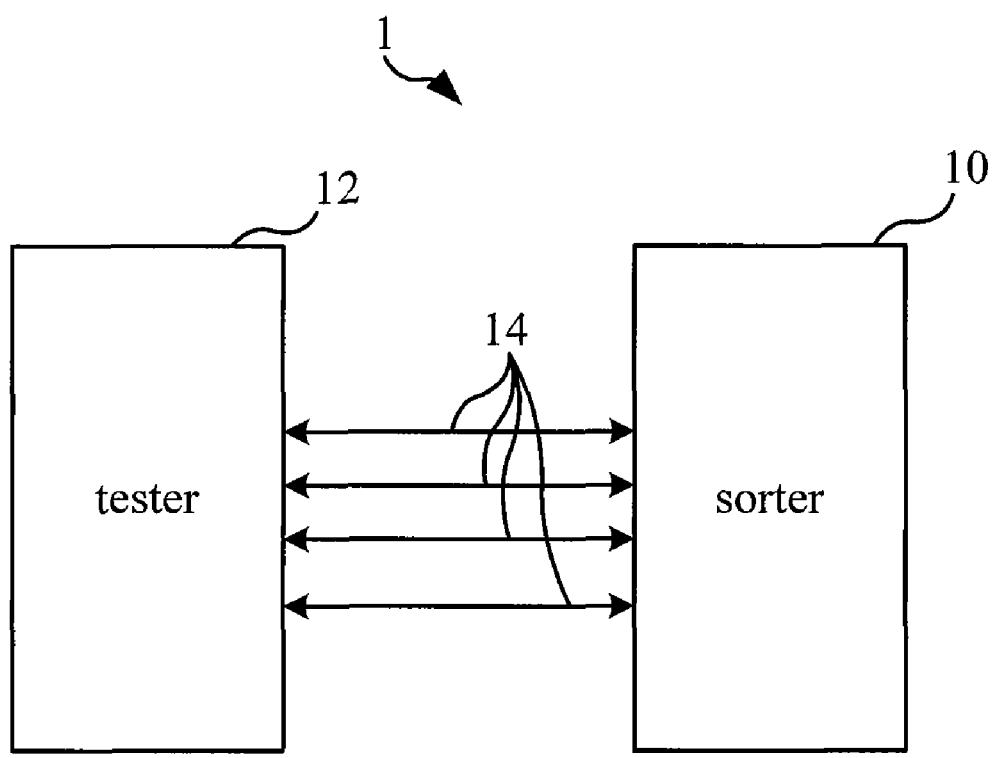
FIG. 1 is a function block diagram of a conventional IC test handler.
Figure 2:
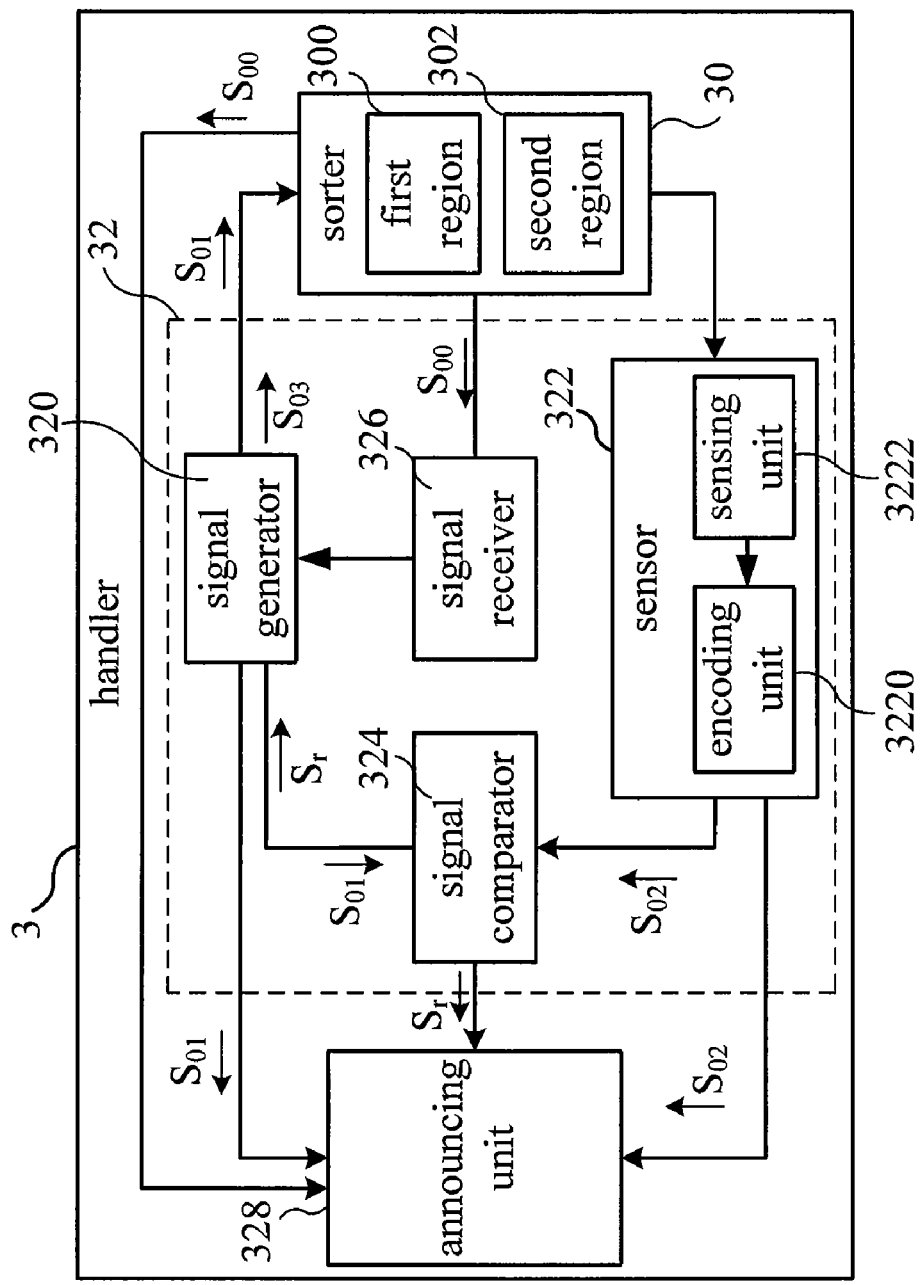
FIG. 2 is a function block diagram of a handler according to one embodiment of the invention.

Please refer to FIG. 2. FIG. 2 is a function block diagram of a handler 3 according to one embodiment of the invention. In the embodiment, the handler 3 of the invention includes a sorter 30 and a testing module 32. The testing module 32 is detachably connected with the sorter 30. In other words, the testing module 32 is built in the sorter 30. In another embodiment, the testing module 32 is a cartridge and the sorter 30 includes a slot corresponding to the cartridge, so that the testing module could be easily inserted into or plucked from the slot of the sorter. However, the structure of the sorter 30 is the same as the conventional one described in prior art and it will not be described here again. Additionally, as shown in FIG. 2, the testing module 32 includes a signal generator 320, a sensor 322, and a signal comparator 324; wherein the signal comparator 324 is electrically connected with the signal generator 320 and the sensor 322.

Figure 3:
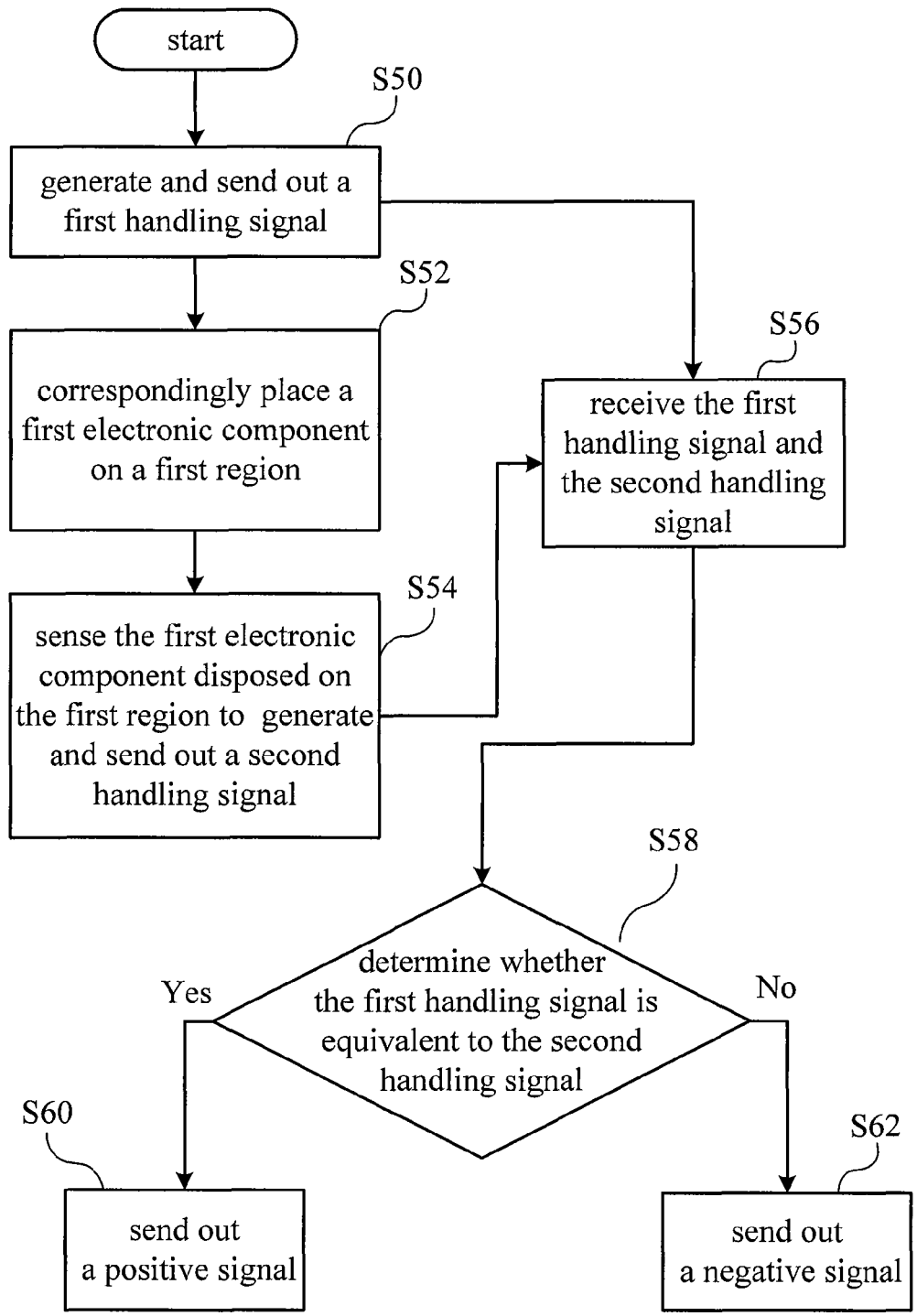
FIG. 3 illustrates a flow chart of a testing method according to one embodiment of the invention.

Additionally, please refer to FIG. 3 to understand a self-testing process of the handler of the invention. FIG. 3 illustrates a flow chart of a testing method according one embodiment of the invention. Steps of the testing method of the invention in sequence are: generating handling signals, testing sorted electronic components, and comparing sorting and testing results. The detail of the steps is described below.

As shown in FIG. 3, first of all, the step S50 is performed. The signal generator generates a first handling signal $S_{01}$. For example, the first handling signal $S_{01}$ is a type code or a quality code of the electrical component. Different type codes represent different package types or pin types. Different quality codes represent different qualities from good to bad.

The testing module 32 of the handler 3 further includes a signal receiver 326 electrically connected with the sorter 32 and the signal generator 320. The sorter 30 can include a start button, and when the user presses the start button, the sorter 30 sends out a starting signal $S_{00}$ to the signal receiver 326. The signal receiver 326 triggers the signal generator 320 according to the starting signal $S_0$, so that the signal generator 320 starts generating the first handling signal $S_{01}$. Thus, the starting of the testing method of the invention is controllable.

Subsequently, the step S52 is performed. The sorter 30 receives the first handling signal $S_{01}$ and correspondingly places a first electronic component (e.g. IC) on a first region 300 according to the first handling signal $S_{01}$. For example, the first handling signal $S_{01}$ is a quality code, and the quality codes are 1 through 16 (from good to bad). The regions for accommodating the sorted electronic components are the first accommodation region through the sixteenth accommodation region. When the sorter 30 receives the first handling signal $S_{01}$ (quality code) coded as "3", the sorter 30 places the first electronic components in the third accommodation region.

The signal generator therein stores a time interval parameter and a signal generating parameter. The signal generator generates different handling signals at different time according to the time interval parameter and the signal generating parameter. In other words, the signal generator 320 is not limited to periodically generate and send out the same handling signal. For example, the signal generator 320 could send out an equivalent handling signal or a handling signal different from previous handling signal every second. Even the signal generator 320 could send out two different handling signals at the same time.

Next, the step 54 is performed. The sensor 322 senses the first electronic component disposed on the first region 300 to correspondingly generate and send out a second handling signal $S_{02}$. There are various kinds of methods for sensing electronic components. For example, the first region 300 includes multiple pin holes, after the sorter 30 places the first electronic component on the first region, multiple pins of the first electronic components can be inserted into the pin holes. The sensor 322 electrifies a specific pin of the first electronic components and determines the quality of the first electronic component for generating the quality code (the second handling signal) by measuring the input and output voltage.

Subsequently, the step S56 is performed. The signal comparator 324 receives the first handling signal $S_{01}$ from the signal generator 320, and receives the second handling signal $S_{02}$ from the sensor 322. Lastly, the step S58 is performed. The signal comparator 324 determines whether the first handling signal $S_{01}$ is equivalent to the second handling signal $S_{02}$ and correspondingly sends out a comparing signal $S_r$. In another embodiment, the first handling signal $S_{01}$ is a binary code. The sensor 322 includes an encoding unit 3220 and a sensing unit 3222 electrically connected with the encoding unit 3220. The sensing unit 3222 senses the first electronic component to generate a sensing signal (e.g. voltage, current, or resistance). The encoding unit 3220 receives the sensing signal and then transforms the sensing signal into the binary-coded second handling signal $S_{02}$. Accordingly, the first handling signal $S_{01}$ and the second handling signal have the same encoding format, so that they could be correctly processed (e.g. addition or subtraction) by the signal comparator 324 to obtain the comparison result.

From the description of the step S50 through the step S58, the handler and the testing method of the invention compare the predetermined handling signal (i.e. the first handling signal) with the testing result (i.e. the second handling signal) of the sorted electronic component. If the testing result is different from the predetermined handling signal, it means the handler does not correctly sort the electrical components. Accordingly, by viewing the comparison result, it will be known whether the handler correctly obeys the predetermined handling signals to sort the electrical components.

After the step S58, if the signal comparator 324 determines that the first handling signal $S_{01}$ is equivalent to the second handling signal $S_{02}$, the step $S_{60}$ is performed and the sent comparing signal $S_r$ is a positive signal. If the signal comparator 324 determines that the first handling signal $S_{01}$ is different from the second handling signal $S_{02}$, the step S62 is performed and the sent comparing signal is a negative signal.

Figure 4:
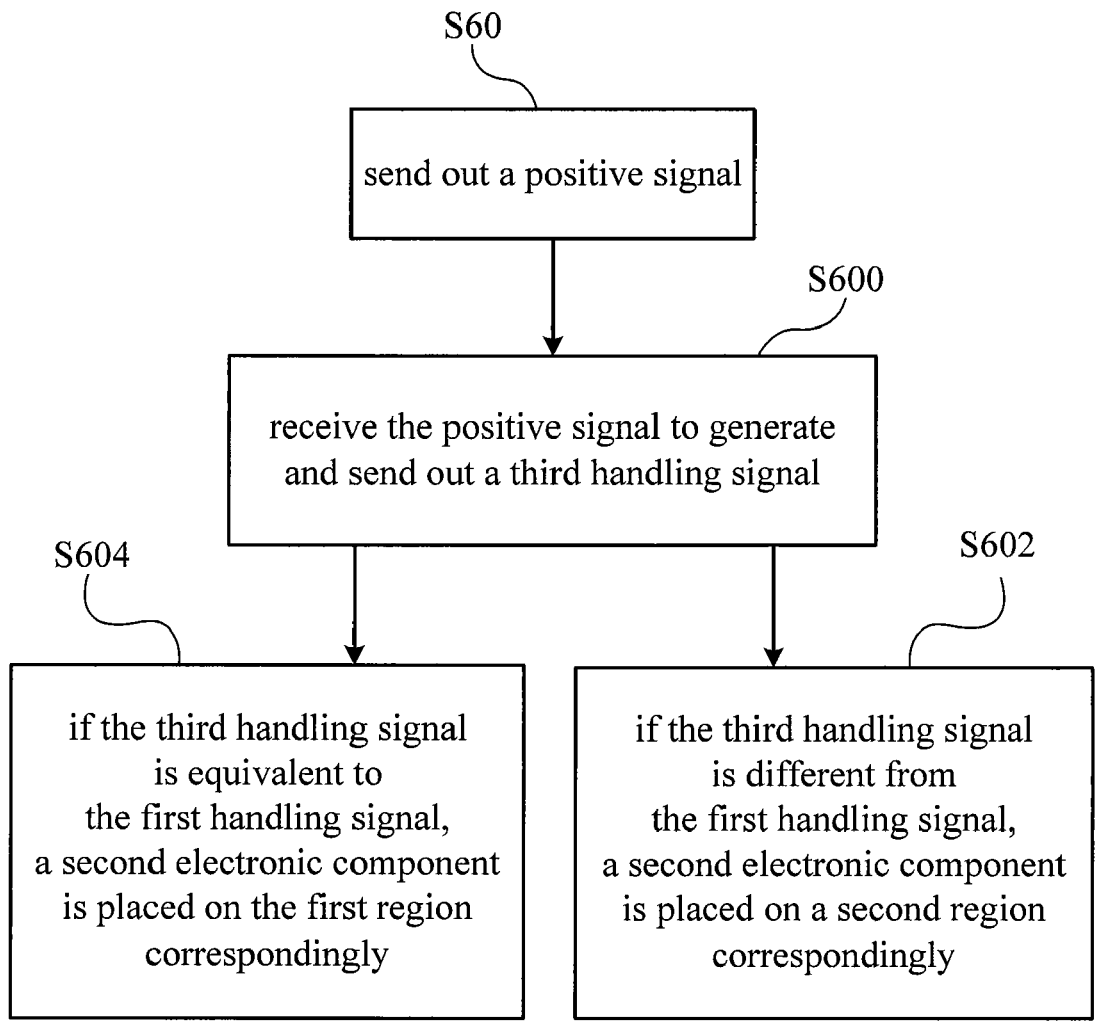
FIG. 4 illustrates a flow chart after step S60 as shown in FIG. 3.

After the step S60, the step S600 is performed as shown in FIG. 4. The signal generator 320 receives the positive signal, generates and sends out a third handling signal $S_{03}$ to the sorter 30. Another testing process similar to the steps S50~S58 begins. Then, if the third handling signal $S_{03}$ is different from the first handling signal $S_{01}$, the step $S_{602}$ is performed, so that the sorter 30 correspondingly places the second electronic component on a second region 302 which is different from the first region 300. On the contrary, if the third handling signal $S_{03}$ is equivalent to the first handling signal $S_{01}$, the step S604 is performed, so that the sorter 30 correspondingly places the second electronic component on the first region 300. In other words, equivalent handling signals correspond to the same region, and the sorter 30 disposes the electronic components on a corresponding handling region according to the handling signal. In a practical situation, the sorter 30 is not limited to include the first region 300 and the second region 302 in this embodiment, and the first region is not necessarily adjacent to the second region.

Figure 5:
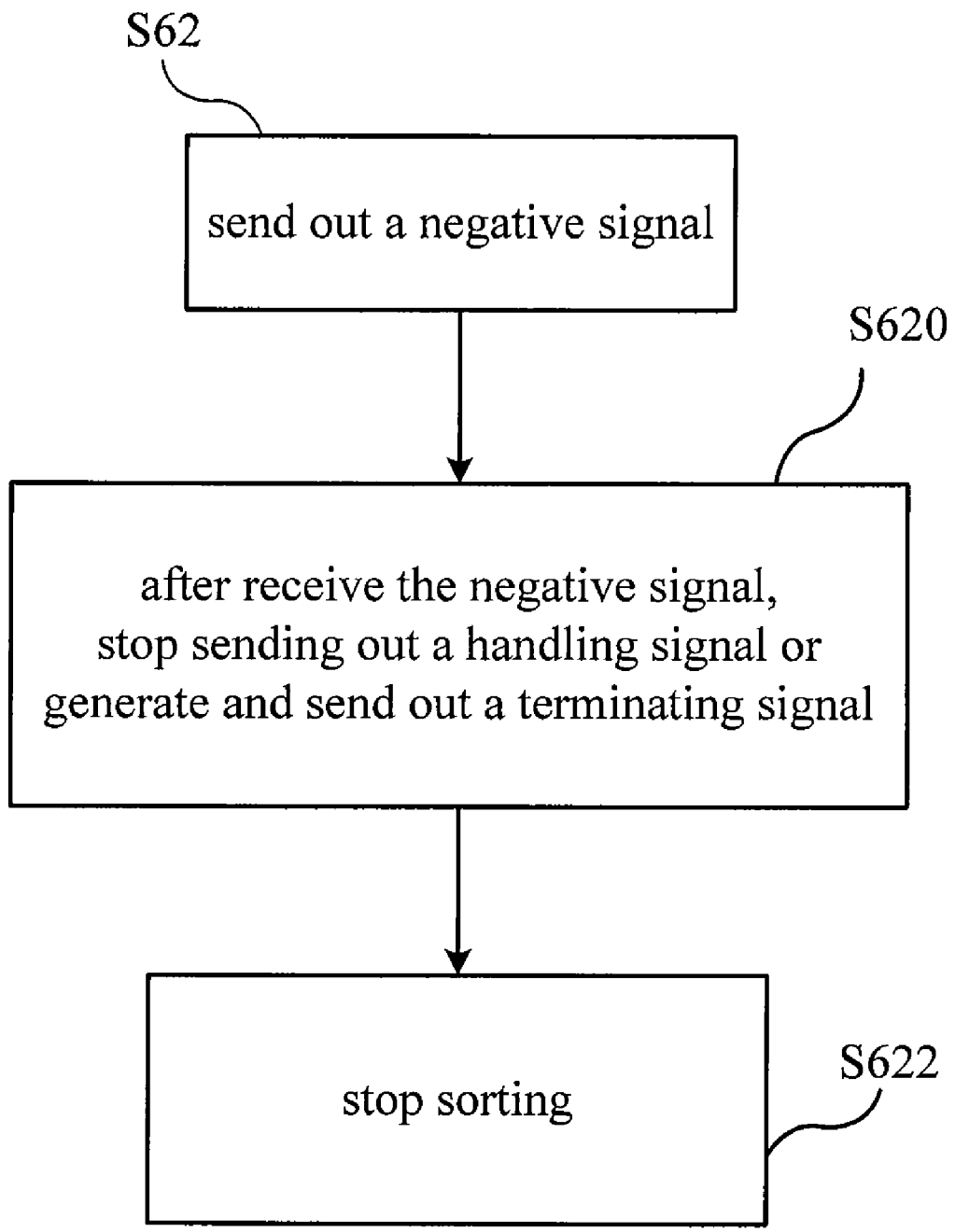
FIG. 5 illustrates a flow chart after step S62 as shown in FIG. 3.

As shown in FIG. 5, after the step S62, the step S620 is performed. The signal generator 320 receives the negative signal, and the signal generator stops sending out a handling signal or generates and sends out a terminating signal to the sorter 30. The sorter 30 stops sorting until receiving a handling signal. Therefore, the user can configure stop conditions of the sorter such as "receiving a terminating signal" or "missing a handling signal", and the sorter can automatically stop sorting when one of the stop conditions is met. During the self-testing procedure, the handler of the invention can automatically stop sorting when an abnormal sorting occurs. Thus, when the handler stops sorting, the user can realize that the handler needs to be examined and repaired. In other words, the handler of the invention does not need human surveillance to reduce the human error.

Additionally, in order to easily monitor the testing process, the handler 3 of the invention further includes an announcing unit 328 electrically connected with the signal generator 320, the sensor 322, and the signal comparator 324. The announcing unit 328 is used for announcing the status information or the handling information to the on-line operator. The announcing unit 328 can be a display to show an image or a text, a speaker for broadcasting an announcing sound, or an indication lamp for indicating different messages by flickering or different colors.

The announcing unit 328 correspondingly announces a starting information $S_{00}$ (e.g. a "START" text) according to a starting signal. The announcing unit 328 correspondingly announces a terminating information (e.g. a "TERMINATION" text) according to the terminating signal. The announcing unit 328 correspondingly announces the first handling information (e.g. a "predetermined quality type: 3" text) and a second handling information (e.g. a "testing result: 3" text) according to the first handling signal $S_{01}$ and second handling signal $S_{02}$. The announcing unit 328 announces comparing information (e.g. a "PASS" text) according to the comparing signal.

To sum up, the handler sorts electrical components (e.g. ICs) according to a first handling signal, and then generates a second handling signal by detecting the sorted electrical component. The handler compares the first handling signal and the second handling signal to generate the comparing signal. The handler keeps or stops sorting ICs according to the comparing signal, so that the handler of the invention can achieve the goal of self-testing. Compared with the prior art, the handler and the testing method for the same do not need a tester and the cables connected between the tester and the sorter. Thereby the invention not only reduces the equipment cost (e.g. the tester and the cables) but also reduces the human error.

Although the present invention has been illustrated and described with reference to the preferred embodiment thereof, it should be understood that it is in no way limited to the details of such embodiment but is capable of numerous modifications within the scope of the appended claims.

What is claimed is:

1. A handler comprising:
a sorter; and
a testing module, detachably connected with the sorter, comprising:
a signal generator, generating and sending out a first handling signal, the sorter receiving the first handling signal and correspondingly placing a first electronic component on a first region according to the first handling signal;
a sensor, sensing the first electronic component disposed on the first region, then correspondingly generating and sending out a second handling signal; and
a signal comparator, electrically connected to the sensor and the signal generator, receiving the first handling signal and the second handling signal, determining whether the first handling signal is equivalent to the second handling signal and correspondingly sending out a comparing signal.

2. The handler of claim 1, wherein if the signal comparator determines that the first handling signal is equal to the second handling signal, the sent comparing signal is a positive signal.

3. The handler of claim 2, wherein after the signal generator receives the positive signal, the signal generator generates and sends out a third handling signal to the sorter.

4. The handler of claim 3, wherein if the third handling signal is different from the first handling signal, the sorter correspondingly places a second electronic component on a second region according to the third handling signal.

5. The handler of claim 3, wherein if the third handling signal is equivalent to the first handling signal, the sorter correspondingly places a second electronic component on the first region according to the third handling signal.

6. The handler of claim 1, wherein if the signal comparator determines that the first handling signal is different from the second handling signal, the sent comparing signal is a negative signal.

7. The handler of claim 6, wherein after the signal generator receives the negative signal, the signal generator stops sending out a handling signal to the sorter.

8. The handler of claim 6, wherein after the signal generator receives the negative signal, the signal generator generates and sends out a terminating signal to the sorter and then the sorter stops handling according to the terminating signal.

9. The handler of claim 8, further comprising an announcing unit electrically connected with the signal generator, the signal generator sending out the terminating signal to the announcing unit, and the announcing unit correspondingly announcing a terminating information according to the terminating signal.

10. The handler of claim 1, further comprising an announcing unit electrically connected with the signal generator and the sensor, the announcing unit correspondingly announcing a first handling information and a second handling information according to the first handling signal and the second handling signal.

11. The handler of claim 1, further comprising an announcing unit electrically connected with the signal comparator, the announcing unit correspondingly announcing a comparing information according to the comparing signal.

12. The handler of claim 11, wherein the announcing unit is a display, a speaker, or an indication lamp.

13. The handler of claim 1, further comprising a signal receiver electrically connected with the sorter and the signal generator, the signal receiver receiving a starting signal sent from the sorter, the signal receiver triggering the signal generator, according to the starting signal, to generate the first handling signal.

14. The handler of claim 13, further comprising an announcing unit electrically connected with the sorter, the announcing unit receiving the starting signal from the sorter and correspondingly announcing a starting information according to the starting signal.

15. The handler of claim 1, wherein the first handling signal and the second handling signal are both binary codes.

16. The handler of claim 15, wherein the sensor further comprises an encoding unit and a sensing unit electrically connected with the encoding unit, the sensing unit senses the first electronic component to generate a sensing signal, the encoding unit receives the sensing signal and transforming the sensing signal into the binary-coded second handling signal.

17. The handler of claim 1, wherein the signal generator therein stores a time interval parameter and a signal generating parameter, the signal generator generates different handling signals at different time according to the time interval parameter and the signal generating parameter.

18. The handler of claim 1, wherein the first electronic component is an integrated circuit.

19. A testing method, comprising the following steps of:
generating and sending out a first handling signal;
correspondingly placing a first electronic component on a first region according to the first handling signal;
sensing the first electronic component disposed on the first region to generate and send out a second handling signal;
receiving the first handling signal and the second handling signal; and
determining whether the first handling signal is equivalent to the second handling signal and correspondingly sending out a comparing signal.

20. The testing method of claim 19, wherein if the first handling signal is equal to the second handling signal, the sent comparing signal is a positive signal.

21. The testing method of claim 20, further comprising the following steps of:
receiving the positive signal to generate and send out a third handling signal different from the first handling signal; and
correspondingly placing a second electronic component on a second region according to the third handling signal.

22. The testing method of claim 20, further comprising the following steps of:
receiving the positive signal to generate and send out a third handling signal equivalent to the first handling signal; and
correspondingly placing a second electronic component on the first region according to the third handling signal.

23. The testing method of claim 19, wherein if the first handling signal is different from the second handling signal, the sent comparing signal is a negative signal.

24. The testing method of claim 23, further comprising the following step of:
stopping sending out a handling signal after receiving the negative signal.

25. The testing method of claim 23, further comprising the steps of:
sending out a terminating signal after receiving the negative signal; and
stopping handling according to the terminating signal.

26. The testing method of claim 25, further comprising the following step of:
announcing a terminating signal according to the terminating signal.

27. The testing method of claim 19, further comprising the following step of:
correspondingly announcing a first handling information and a second handling information according to the first handling signal and the second handling signal.

28. The testing method of claim 19, further comprising the following step of:
correspondingly announcing a comparing information according to the comparing signal.

29. The testing method of claim 19, before the step of generating the first handling signal, further comprising the following steps of:
receiving a starting signal; and
generating the first handling signal according to the starting signal.

30. The testing method of claim 29, further comprising the following step of:
correspondingly announcing a starting information according to the starting signal.

31. The testing method of claim 19, wherein the step of sensing the first electronic component to generate the second handling signal comprises the following steps of:
sensing the first electronic component to generate a sensing signal; and
receiving the sensing signal and transforming the sensing signal into the second handling signal in binary form.

32. The testing method of claim 19, wherein the first electronic component is an integrated circuit.

* * * * *